US011552600B2

United States Patent
Kurylak et al.

(10) Patent No.: US 11,552,600 B2
(45) Date of Patent: Jan. 10, 2023

(54) PHOTODIODE CATHODE BIASING

(71) Applicant: Cisco Technology, Inc., San Jose, CA (US)

(72) Inventors: Alexander C. Kurylak, Bethlehem, PA (US); Kadaba Lakshmikumar, Basking Ridge, NJ (US)

(73) Assignee: Cisco Technology, Inc., San Jose, CA (US)

( * ) Notice: Subject to any disclaimer, the term of this patent is extended or adjusted under 35 U.S.C. 154(b) by 115 days.

(21) Appl. No.: 16/553,950

(22) Filed: Aug. 28, 2019

(65) Prior Publication Data

US 2021/0067105 A1 Mar. 4, 2021

(51) Int. Cl.
*H03F 3/08* (2006.01)
*H04B 10/69* (2013.01)

(52) U.S. Cl.
CPC ......... *H03F 3/082* (2013.01); *H04B 10/6911* (2013.01)

(58) Field of Classification Search
CPC .... H03F 3/082; H03F 3/345; H03F 2200/474; H03F 3/45475; H04B 10/6911
USPC ...... 330/279, 308; 250/124 A, 214 R, 214 A
See application file for complete search history.

(56) References Cited

U.S. PATENT DOCUMENTS

| 3,911,268 | A | 10/1975 | Mori et al. |
| 5,270,533 | A | 12/1993 | Pulice |
| 8,121,495 | B2* | 2/2012 | Tourette ................. H03F 3/082 |
| | | | 398/202 |
| 8,138,463 | B2 | 3/2012 | Hadwen et al. |
| 8,901,475 | B1 | 12/2014 | Joffe et al. |
| 2002/0041417 | A1* | 4/2002 | Han .................... H04B 10/6933 |
| | | | 398/202 |
| 2008/0308716 | A1 | 12/2008 | Byren |

\* cited by examiner

*Primary Examiner* — Samuel S Outten
*Assistant Examiner* — Khiem D Nguyen
(74) *Attorney, Agent, or Firm* — Patterson + Sheridan, LLP (57) ABSTRACT

In one embodiment, stable and controlled circuit element biasing is provided in a circuit comprising a voltage source operable to output a first voltage, a reference voltage source operable to output a reference voltage, a circuit element biased, during operation, by the first voltage at a first end and by a second voltage at a second end, a voltage controller coupled to the second end of the circuit element, wherein the voltage controller is operable to adjust the second voltage based on a gain output, a gain controller operable to receive the reference voltage as a first input and the second voltage as a second input, wherein the gain controller is operable to generate, at an output of the gain controller, the gain output based on the second voltage and the reference voltage, and a feedback loop that extends from the output of the gain controller, through the voltage controller, and to the second input.

16 Claims, 7 Drawing Sheets

PHOTODIODE CATHODE BIASING

TECHNICAL FIELD

Embodiments presented in this disclosure generally relate to electrical circuits. More specifically, embodiments disclosed herein relate to controlling and stabilizing voltage bias used to bias a light detector.

BACKGROUND

Circuit elements have operating ranges that define tolerable operating conditions for achieving the rated performance of the circuit elements. A circuit element operating within its operating range can be expected to perform as indicated in the rating of the circuit element. A circuit element operating outside of its operating range faces the risk of performing below its rating. In extreme cases, a circuit element operating outside of its operating range may break down, leading to a complete loss of functionality of the circuit element.

Even when a circuit element is operating within its operating range, there can be variations in the performance of the circuit element. This can occur, for example, when the circuit element is part of a high-speed system and there are sudden swings in operating conditions that still fall within the operating range of the circuit element.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a system comprising a photodiode biased, during operation, by a first voltage and a second voltage, a voltage source operable to output the first voltage, a reference voltage source operable to output a reference voltage, a gain controller operable to receive the reference voltage as a first input and the second voltage as a second input, wherein the gain controller is operable to generate a gain output at an output, a voltage controller, and a feedback loop that extends from the output controller to the second input, wherein the voltage controller is operable to control the second voltage based on the gain output.

One embodiment presented in this disclosure is a method for stable photodiode biasing comprising generating a reference voltage, a first voltage, and a second voltage, generating a gain output based on comparing the reference voltage to the second voltage, adjusting the second voltage, based on the gain output, by a voltage controller, wherein the voltage controller operates in a feedback loop from an output of a gain controller to an input of the gain controller, and biasing a photodiode using the second voltage and a first voltage.

One embodiment presented in this disclosure is a circuit for stable circuit element biasing comprising: a voltage source operable to output a first voltage, a reference voltage source operable to output a reference voltage, a circuit element biased, during operation, by the first voltage at a first end and by a second voltage at a second end, a voltage controller coupled to the second end of the circuit element, wherein the voltage controller is operable to adjust the second voltage based on a gain output, a gain controller operable to receive the reference voltage as a first input and the second voltage as a second input, wherein the gain controller is operable to generate, at an output of the gain controller, the gain output based on the second voltage and the reference voltage, and a feedback loop that extends from the output of the gain controller, through the voltage controller, and to the second input.

EXAMPLE EMBODIMENTS

So that the manner in which features of the present disclosure can be understood in detail, embodiments of the present invention disclosed herein may use a photodiode (PD) as the circuit element, and an operational amplifier (opamp) as the gain controller. However, the circuit element and gain controller should not be interpreted as being confined to a photodiode and opamp, respectively.

A photodiode outputs current, known as photocurrent, when there is light incident on a reverse-biased PN junction of the photodiode. A PN junction is a depletion layer formed at the boundary of a coupling between a p-type semiconductor and an n-type semiconductor. The diode can also output a small current, known as dark current, when there is no light incident on the reverse-biased PN junction of the photodiode. There are many causes of dark current, such as ambient radiation, high temperatures, or a bias voltage applied to the photodiode. All of these parameters may be controlled, or the photodiode may be calibrated, to ensure that the photodiode operates inside of its operating range.

One danger in using a photodiode is the potential breakdown of the photodiode due to operating at a voltage outside of its operating range. This is particularly worrisome when there is no light incident on the reverse-biased PN junction of the photodiode because, even if there is a small dark current flowing through the photodiode, there may be a high bias voltage applied to the photodiode. If this high voltage is outside the operating range of the photodiode, the photodiode may break down and lose its intended functionality.

Another danger in using a photodiode is a drop in the bandwidth of the photodiode when the voltage across the photodiode is too low. This drop in bandwidth may cause sub-optimal performance of the photodiode during circuit operation.

In the embodiments herein, the voltage across the photodiode is stabilized and tightly controlled across the operating range of the photodiode, thereby mitigating the risk of large changes in the voltage across the photodiode, which can cause the photodiode to break down or malfunction, and avoiding sub-optimal photodiode performance during circuit operation.

An opamp outputs a gain amplification signal based on its inverting and non-inverting inputs. The output of the opamp is typically connected, directly or indirectly, to either the inverting input or non-inverting input to establish a feedback loop. When the voltages of the inverting and non-inverting inputs are within the voltage range established by the voltages applied to the rails of the opamp, the opamp operates to maintain a virtual short across the inverting and non-inverting inputs, thereby making the voltage at the inverting input equal to the voltage at the non-inverting input.

In one embodiment of the present invention, in ensuring the virtual short, the opamp operates to attenuate noisy signals encountered in the feedback loop. For example, if a noisy power supply applies its signal in the feedback loop, the opamp reduces the noise in order to ensure that the voltages at the inverting and non-inverting inputs of the opamp are mirrored. This reduces the need for a large bypass capacitor to filter the noise signals from the power supply. Thus, a smaller bypass capacitor may be used. A smaller capacitor requires less chip area, which reduces the cost of the chip.

Figure 1:
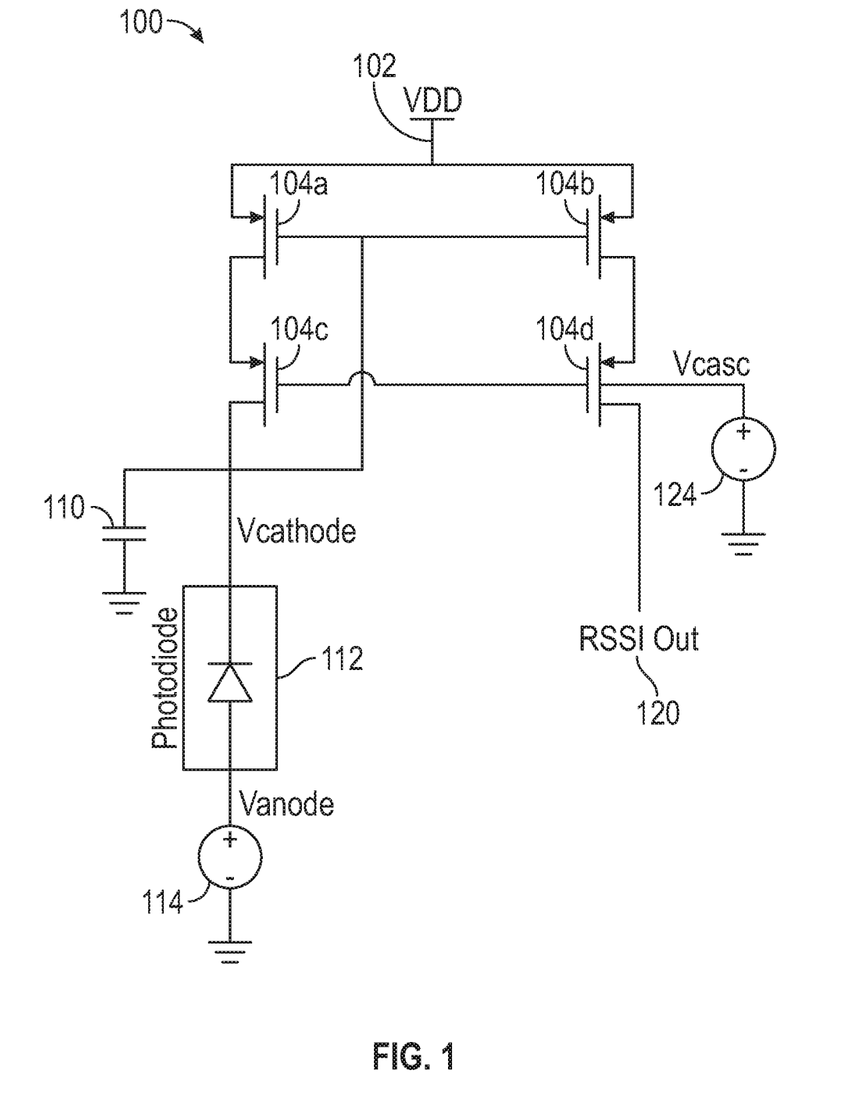
FIG. 1 illustrates a system for providing a voltage bias to a circuit element according to one embodiment of the present invention.

FIG. 1 illustrates a system for providing a voltage bias to a circuit element according to one embodiment of the present invention. In one embodiment, a supply voltage source 102 generates a supply voltage (Vdd) applied to a main input transistor 104a of a primary current mirror (formed by transistors 104a and 104b). Vdd may be approximately 2.7 V. A voltage source 114 generates a voltage (Vanode) applied to an anode of a photodiode 112. Vanode may be a voltage between 0 V-0.5 V. A cascode voltage source 124 generates a voltage (Vcasc) applied to the gates of transistors in a cascode current mirror (formed by transistors 104c and 104d). Vcasc is typically selected in such a way that the transistors of the cascode current mirror (104c and 104d) are kept in saturation mode. In one embodiment, the photodiode 112 may have an operating range from 0 V-1.8 V. Vdd is set higher than the operating range of the photodiode 112 to provide margin for the drop in voltage across the photodiode 112 when it transitions from outputting dark current (when no optical signal is incident on the photodiode 112) to outputting photocurrent (when an optical signal is incident on the photodiode 112).

The primary current mirror may have two p-type metal oxide semiconductor (PMOS) transistors (104a and 104b), with PMOS transistor 104a operating as the main input to the primary current mirror. The primary current mirror is low impedance, and is used to set a voltage at the cathode (Vcathode) of the photodiode 112. Vcathode is dependent on the photocurrent of the photodiode 112, as well as process, temperature and other parameters. When there is no light incident on the reverse-biased PN junction of the photodiode 112, such that only dark current may flow through the photodiode 112, the voltage at Vcathode may drift to the value of Vdd. Thus, in this embodiment, the voltage across the PD is a function of the current flowing through it.

The cascode current mirror (formed by transistors 104c and 104d) operates to increase the impedance facing the primary current mirror (formed by transistors 104a and 104b). The current flowing through reference transistors (104a and 104c) is mirrored to destination transistors (104b and 104d), enabling the measurement of the Received Signal Strength Indicator (RSSI) Out 120, an indicator of the intensity of light incident on the reverse-biased PN junction of the photodiode 112, to be measured at the indicated location in the circuit 100. RSSI Out 120 may also be measured at other locations in the circuit 100.

It is possible for a noisy supply voltage source 102 to inject a small alternating current (AC) signal at Vcathode. The AC signal may modulate the depletion capacitance of the photodiode, which introduces a displacement current into the nodes connected to Vcathode. The displacement current joins the signal current, thereby producing a noisy signal at Vcathode. A capacitor 110 may be connected to the gates of the primary current mirror (formed by transistors 104a and 104b) and to the cathode of the photodiode 112 to bypass any such noise. The noise is then bypassed to ground, leaving the Vcathode as a noise-less signal.

While the embodiment in FIG. 1 does control the voltage bias across the photodiode 112, this voltage bias is not stable or tightly controlled. Vcathode can vary greatly since it is dependent on the current from the photodiode 112, which is dependent on the intensity of light incident on the reverse-biased PN junction of the photodiode. For example, when there is no light incident on the reverse-biased PN junction of the photodiode 112, there may be a high voltage bias applied to the photodiode 112. If the high voltage bias is outside of the operating range of the photodiode 112, the photodiode may break down or malfunction.

The foregoing embodiments provide for a stable and tightly controlled voltage bias to a photodiode, such that the voltage across the photodiode is the same under all operating conditions. However, the embodiments are not limited to such and can be used to control the voltage across other types of circuit elements.

Figure 2:
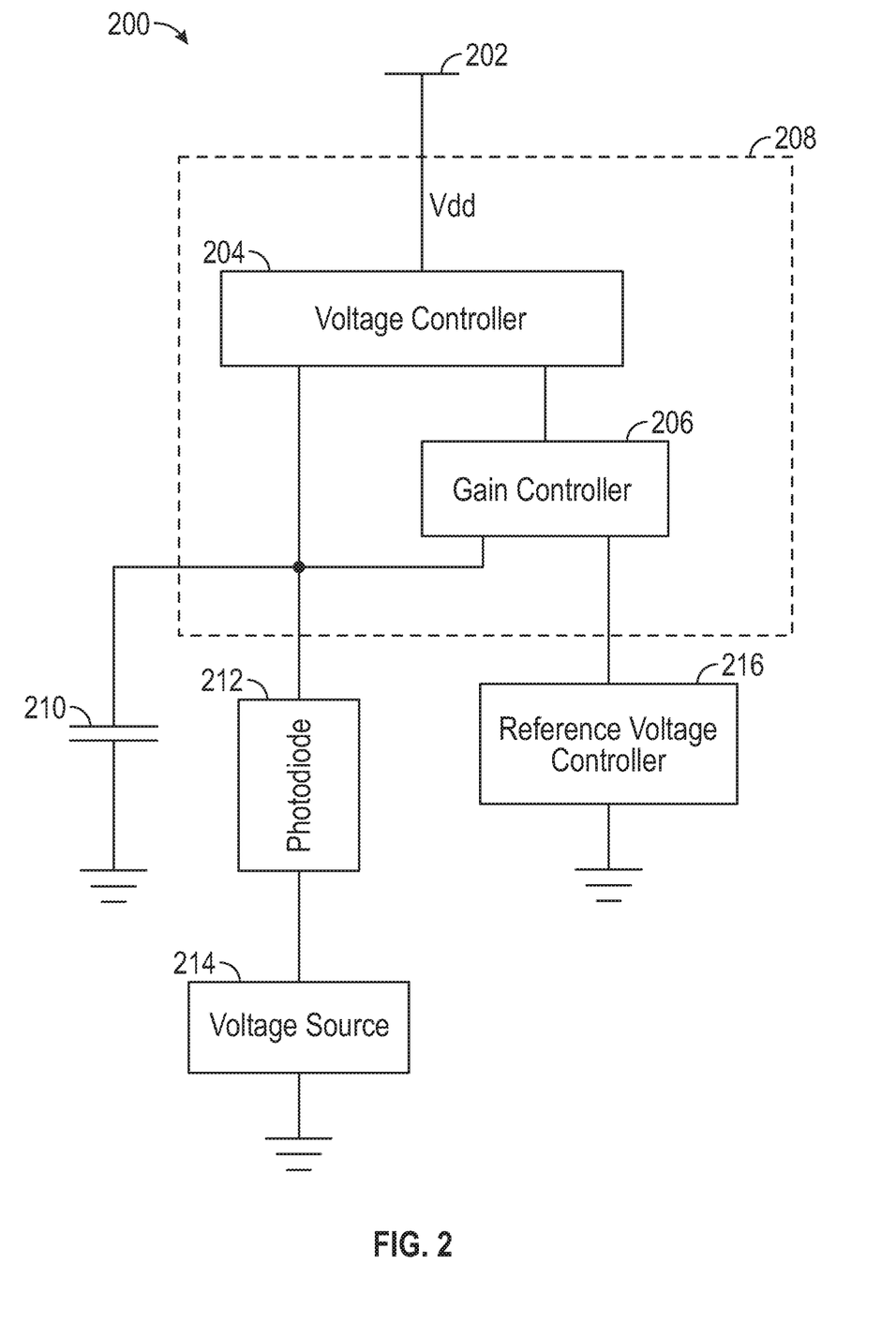
FIG. 2 illustrates a system for providing a stable and controlled voltage bias to a circuit element according to one embodiment of the present invention.

FIG. 2 illustrates a system for providing a stable and controlled voltage bias to a circuit element according to one embodiment of the present invention. In one embodiment, a supply voltage source 202, a voltage source 214, and a reference voltage controller 216 are used to set the voltage difference across a photodiode 212 within its operating range. The voltage source 214 is used to supply a first voltage of the photodiode 212. The reference voltage controller 216 supplies a reference voltage (Vref) to a gain controller 206. A second voltage of the photodiode 212 is also supplied to the gain controller 206. Vref is the voltage that is to be mirrored to the second voltage of the circuit element.

The gain controller 206 produces a gain output, which is an amplified signal based on Vref and the second voltage of the circuit element. The gain output is supplied to a voltage controller 204, which controls the second voltage of the photodiode 212 based on the gain output from the gain controller 206. The second voltage of the photodiode 212 is supplied to the gain controller 206, thereby forming a feedback loop 208 of the gain controller 206. The gain controller 206 uses the feedback loop 208 to ensure the mirroring of Vref to the second voltage of the photodiode 212 by varying its gain output to the voltage controller 204.

A capacitor 210 may be attached to an output of the voltage controller 204 to attenuate noise signals affecting the second voltage of the photodiode 212.

Since the first voltage across the photodiode 212 is controlled by the voltage source 214, and the second voltage across the photodiode 212 follows the reference voltage controller 216, the voltage difference across the photodiode 212 is tightly controlled. Tightly controlling the voltage difference across the photodiode 212 allows the photodiode 212 to operate at a chosen, stable voltage. Hence, the photodiode 212 is always able to operate at its ideal operating voltage, irrespective of the operating conditions of the circuit 200, thereby enabling the photodiode 212 to deliver superior performance.

Figure 3:
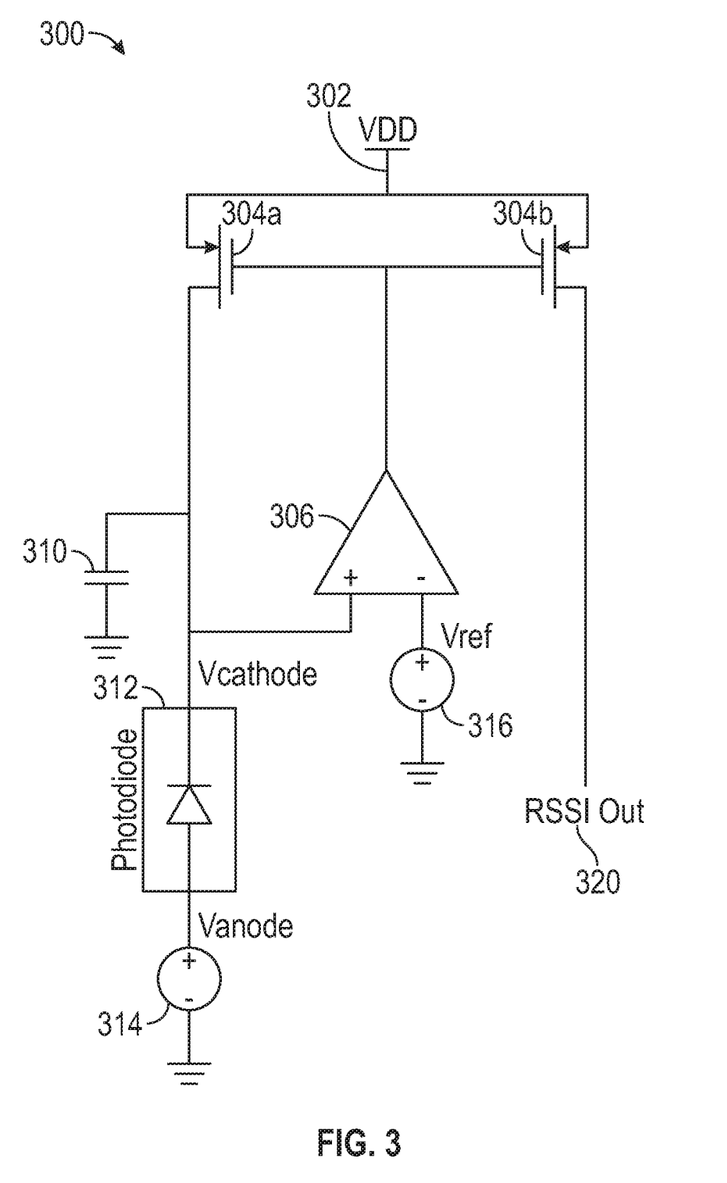
FIG. 3 illustrates a system for providing a stable, controlled, noise-attenuated voltage bias to a circuit element, with an indication of signal strength output by the circuit element, according to one embodiment of the present invention.

FIG. 3 illustrates a system for providing a stable, controlled, noise-attenuated voltage bias to a circuit element, with an indication of signal strength output by the circuit element, according to one embodiment of the present invention.

In one embodiment, a supply voltage source 302, a voltage source 314, and a reference voltage controller are used to set the voltage difference across a photodiode 312 within the operating range of the photodiode 312. The voltage source 314 is used to supply Vanode to the photodiode 312. The reference voltage controller is a reference voltage source 316 that supplies Vref to an opamp 306. Vcathode is also supplied to the opamp 306. Vref is the voltage that is to be mirrored to Vcathode.

The opamp 306 produces a gain output, which is an amplified signal based on Vref and Vcathode. The gain output is supplied to the gates of a current mirror (formed by transistors 304a and 304b), which determines and outputs Vcathode based on the gain output from the opamp 306. Vcathode is supplied to the opamp 306, thereby forming a feedback loop of the opamp 306.

The gain of the opamp 306 is constrained by the voltage applied to the rails of the opamp 306 (not shown). When Vcathode and Vref are within the voltage range established by the voltages applied to the rails of the opamp 306, the opamp 306 operates to maintain a virtual short across Vcathode and Vref, thereby making Vcathode equal to Vref. The opamp 306 establishes this virtual short by adjusting the gain output to ensure that Vcathode and Vref are mirrored.

In one embodiment, the current mirror operates as a voltage controller comprising a first transistor (304a) and a second transistor (304b). The first transistor is coupled to a photodiode and an input of the opamp (306). A gate of the first transistor (304a) and a gate of the second transistor are coupled to the output of the opamp (306).

When an optical signal is first incident on the photodiode 312, Vcathode changes due to the increase in the average photocurrent caused by the light striking the photodiode 312. The opamp 306 compensates for this change in Vcathode by changing its gain output. Because the gain output supplies a relatively high variable voltage to the gates of the current mirror, the transistors 304a and 304b that form the current mirror operate in saturation mode and allow/disallow current to flow between the source and drain in proportion to the gain output from the opamp 306. This control of the current through the current mirror (formed by transistors 304a and 304b) operates to ensure that Vcathode closely tracks Vref as the photocurrent flowing through the photodiode 312 changes.

The current mirror (formed by transistors 304a and 304b) also mirrors the current flowing through reference transistor 304a to destination transistor 304b, enabling the measurement of the RSSI Out 320, an indicator of the intensity of light incident on the reverse-biased PN junction of the photodiode 312, to be measured at the indicated location in the circuit 300. RSSI Out 320 may also be measured at other locations in the circuit 300.

A capacitor 310 may be attached to an output of the current mirror (formed by transistors 304a and 304b) to attenuate noise signals affecting Vcathode. Since the opamp, while ensuring the existence of the virtual short, also attenuates noisy signals encountered in the feedback loop, as compared to circuits without such a gain controller, a lower capacitance (and lower cost) bypass capacitor may be used to filter noise signals.

Since the voltage across the photodiode 312 (Vanode and Vcathode) is tightly controlled by the opamp 306 and its accompanying feedback loop, operation of the photodiode 312 can be stabilized at a chosen voltage within the operating range of the photodiode 312. Further, since the feedback loop eliminates variations affecting Vcathode as the photodiode 312 transitions from outputting dark current to outputting photocurrent, there is no need to provide a margin with Vdd to compensate for changes in Vcathode. Thus, in one embodiment, Vdd is not greater than the maximum voltage within the operating range of the photodiode 312. In one embodiment, Vdd may be set to the maximum operating voltage within the operating range of the photodiode 312.

Figure 4:
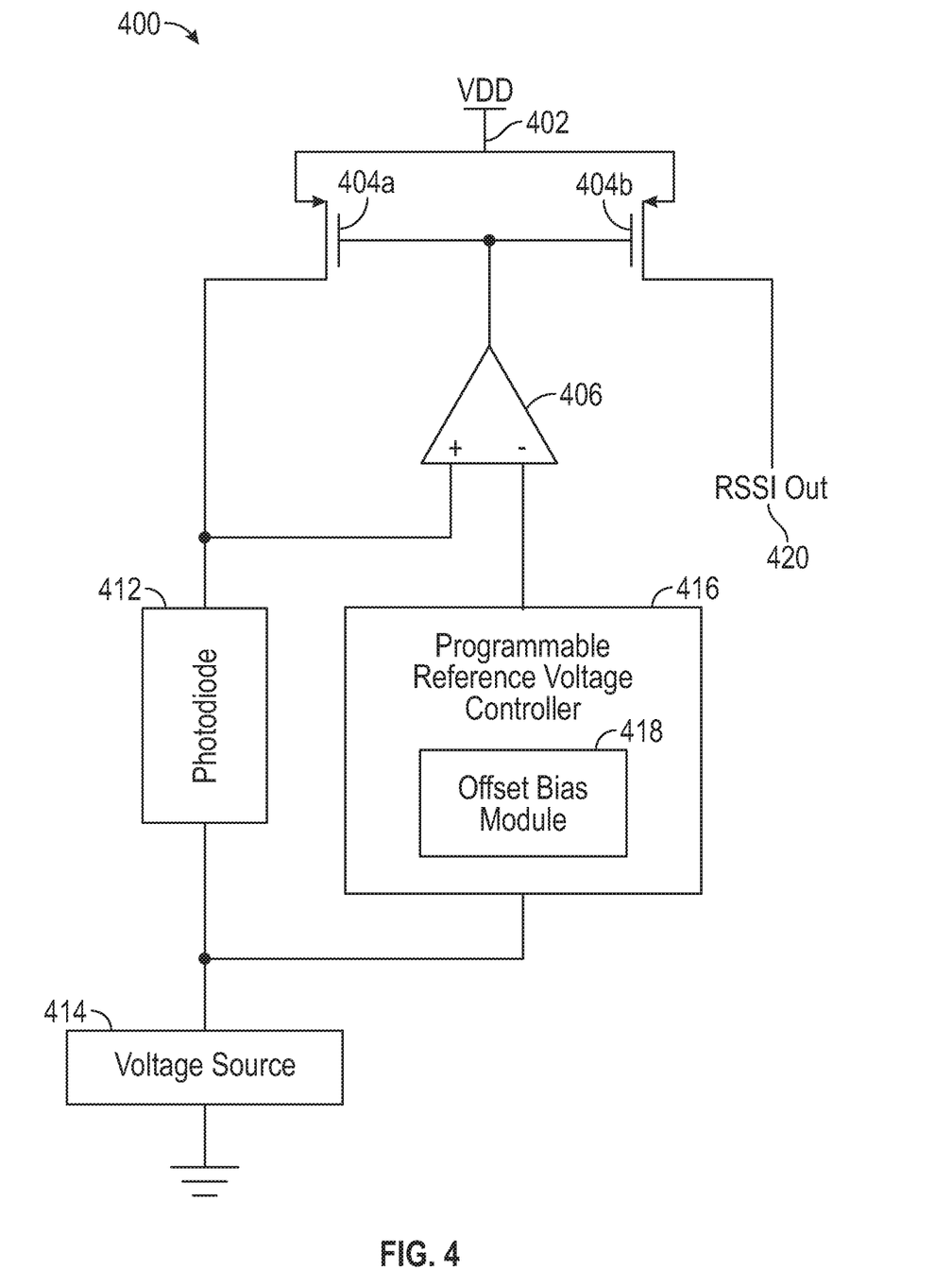
FIG. 4 illustrates a system for providing a stable and controllable voltage bias to a circuit element, with an indication of signal strength output by the circuit element, according to one embodiment of the present invention.

FIG. 4 illustrates a system for providing a stable and controllable voltage bias to a circuit element, with an indication of signal strength output by the circuit element, according to one embodiment of the present invention. In one embodiment, a programmable reference voltage controller 416 is configured to control a reference voltage based on an offset bias received from an offset bias module 418. Adding this programmable reference voltage controller 416 increases compatibility between potential circuit elements and the circuit 400. For example, the circuit 400 can be interchangeably used with different photodiodes that have different operating conditions, accounting for the differing operating conditions of the photodiodes by programming an appropriate Vref to establish a stable and controlled Vcathode within the operating range of the photodiode 412 that is implemented in the circuit 400.

The offset bias module 418 may be set based on Vanode. Setting an offset bias based on Vanode allows a constant voltage difference across the photodiode 412. Thus, even if Vanode varies, Vcathode may be adjusted to maintain the constant voltage difference across the photodiode 412. Therefore, the photodiode 412 is biased at a constant and controlled voltage bias within its operating range.

Figure 5:
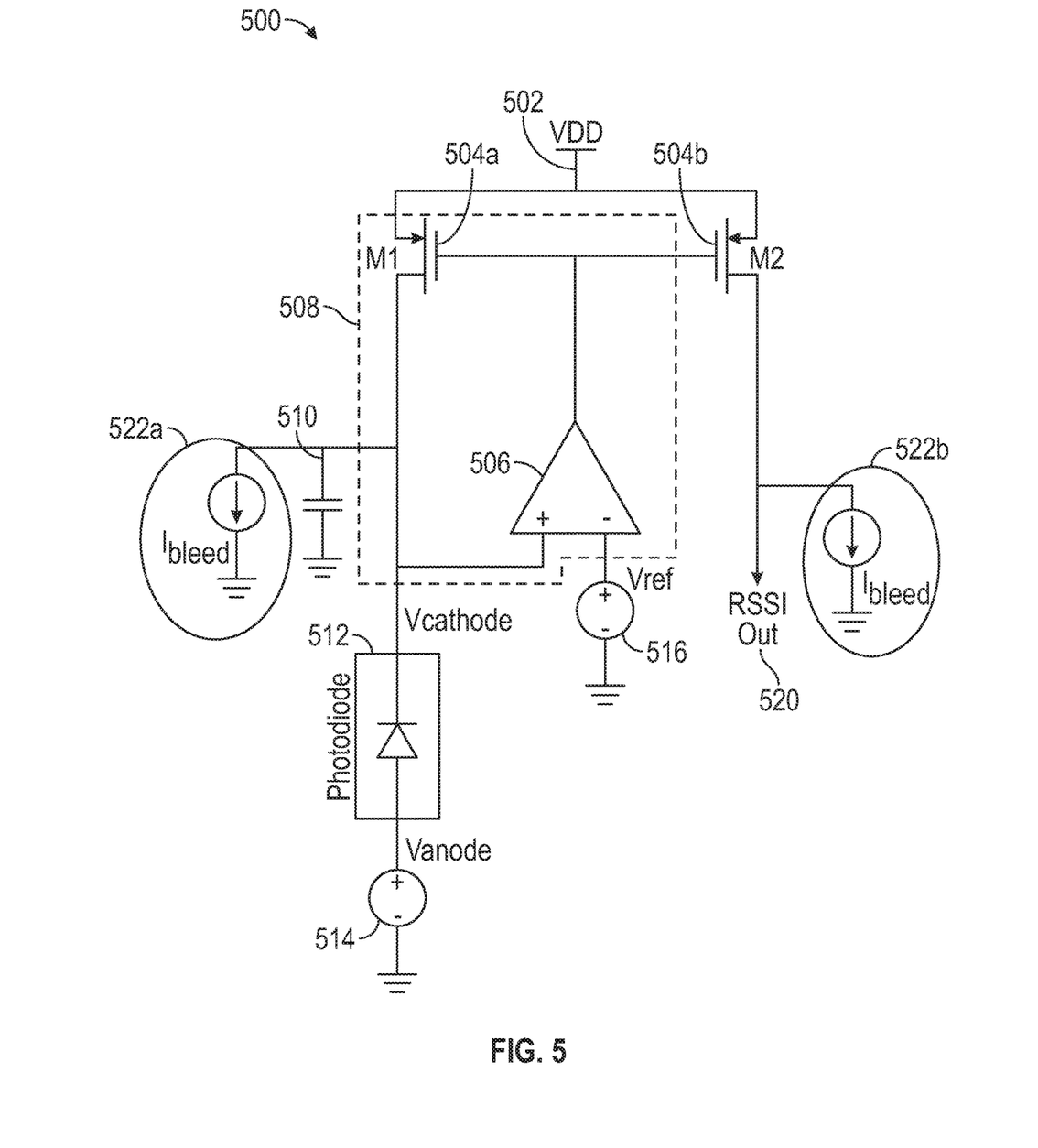
FIG. 5 illustrates a system for ensuring operation of a circuit, while stabilizing and controlling a voltage bias to a circuit element, according to one embodiment of the present invention.

FIG. 5 illustrates a system for ensuring operation of a circuit, while stabilizing and controlling a voltage bias to a circuit element, according to one embodiment of the present invention. In one embodiment, when there is no light incident on the reverse-biased PN junction of the photodiode 512, the photodiode 512 may only output a small dark current. Because there is little current flowing through the photodiode 512, and no current flows into or out of the opamp 506, there may be a small current across the reference transistor 504a of the current mirror (formed by transistors 504a and 504b). In this instance, the transistors of the current mirror (504a and 504b) may operate close to their threshold voltage, and may be kept in their off state.

If the transistors of the current mirror (504a and 504b) turn off, no current flows in the circuit 500. With no current flow in the circuit 500, the gain of the feedback loop 508, which includes opamp 506 and transistor 504a, can drop and Vcathode may drift to Vdd. If Vdd is outside of the operating range of the photodiode 512, the photodiode 512 may break down and malfunction. In one embodiment, Vdd is set to a voltage within the operating range of the photodiode 512 to prevent a breakdown of the photodiode 512.

In another embodiment, bleeder current sources 522a and 522b are attached to the outputs of the current mirror, formed by transistors 504a and 504b, to prevent the breakdown of the photodiode 512. The bleeder current sources 522a and 522b may output enough bleeder current (e.g. a minimum current flow) to keep the feedback loop in a high gain state. Adding the bleeder current sources 522a and 522b ensures that a bleeder current is always flowing through the circuit 500. Therefore, the feedback loop 508 remains in a high gain state and the circuit 500 continues to operate to stabilize and control the voltages across the photodiode 512.

Figure 6:
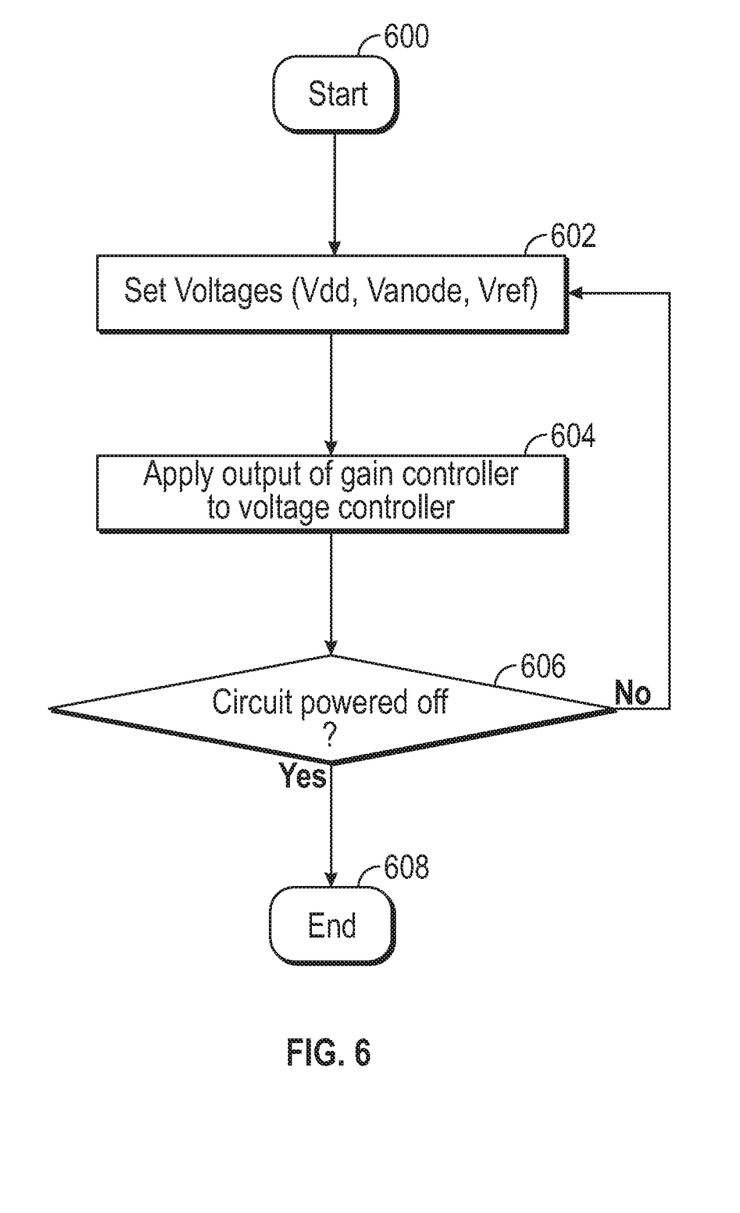
FIG. 6 illustrates a flowchart for providing a stable and controlled voltage bias to a circuit element according to one embodiment of the present invention.
Figure 7:
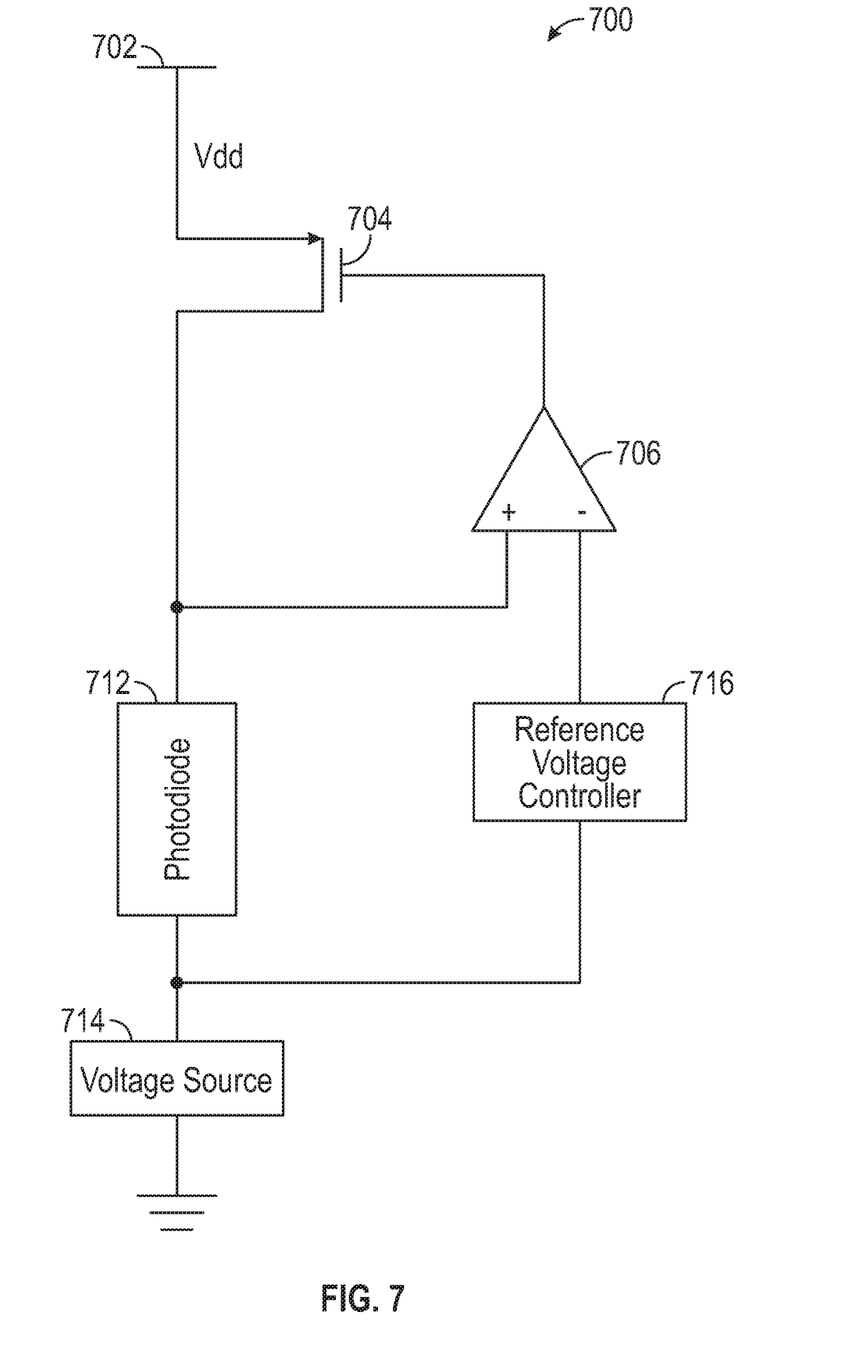
FIG. 7 illustrates a system for providing a stable and controlled voltage bias to a circuit element according to one embodiment of the present invention.

FIG. 6 illustrates a flowchart of a method for providing a stable and controlled voltage bias to a circuit element according to one embodiment of the present invention. FIG. 7 illustrates a system for providing a stable and controlled voltage bias to a circuit element according to one embodiment of the present invention. FIG. 6 is explained in conjunction with FIG. 7.

At step 602, a supply voltage source 702 outputs Vdd, which is applied to a transistor 704; a voltage source 714 outputs Vanode; and a reference voltage controller 716 outputs Vref, which is input into an opamp 706.

At step 604, the opamp 706 outputs a gain signal based on Vref and Vcathode. Vcathode is determined by a feedback loop comprising the opamp 706 and transistor 704. The gain output of the opamp 706 is applied to the gate of the transistor 704 to control the current between the drain and the source of the transistor 704. Since Vanode is controlled (e.g., Vanode may be held constant at a voltage within the operating range of the photodiode 712), controlling the current controls Vcathode. The opamp 706 operates to ensure that Vcathode mirrors Vref.

At step 606, the method for providing a stable and controlled voltage bias to a circuit element is repeated (i.e., the opamp 706 continues to operate to ensure the Vcathode mirrors Vref as the photocurrent flowing through the photodiode 712 changes), or until the circuit 700 is powered off.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product.

Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, radio frequency (RF), etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A system comprising:
a photodiode biased, during operation, by a first voltage and a second voltage;
a voltage source operable to output the first voltage;
a reference voltage source operable to output a reference voltage;
a programmable reference voltage controller operable to control the reference voltage based on an offset bias received from an offset bias module, wherein the offset bias is based on the first voltage;
a gain controller operable to receive the reference voltage as a first input and the second voltage as a second input, wherein the gain controller is operable to generate a gain output at an output;
a voltage controller; and
a feedback loop that extends from the output through the voltage controller to the second input,
wherein the voltage controller is operable to control the second voltage based on the gain output.

2. The system of claim 1, wherein the voltage controller comprises a first transistor, wherein a gate of the first transistor is coupled to the output of the gain controller.

3. The system of claim 2, wherein the first transistor is coupled to a first end of the photodiode and the second input of the gain controller.

4. The system of claim 2, wherein the voltage controller comprises a second transistor, wherein a gate of the second transistor is coupled to the output of the gain controller, wherein the second transistor and the first transistor form a current mirror.

5. The system of claim 1, wherein the gain controller comprises an operational amplifier.

6. The system of claim 1, further comprising:
one or more bleeder currents operable to ensure a minimum current flow through at least one of the voltage controller and the feedback loop.

7. A method for stable photodiode biasing comprising:
generating a reference voltage, a first voltage, and a second voltage, wherein the reference voltage is adjusted based on a received offset bias, wherein the received offset bias is based on the first voltage;
generating a gain output based on comparing the reference voltage to the second voltage;
adjusting the second voltage, based on the gain output, by a voltage controller, wherein the voltage controller operates in a feedback loop from an output of a gain controller to an input of the gain controller; and
biasing a photodiode using the second voltage and the first voltage.

8. The method of claim 7, wherein the first voltage is an anode voltage for the photodiode and the second voltage is a cathode voltage of the photodiode.

9. The method of claim 7, further comprising:
ensuring current flow through at least one of the voltage controller or the feedback loop using one or more bleeder currents.

10. The method of claim 7, further comprising:
filtering noise signals using a capacitor connected to an output of the voltage controller.

11. The method of claim 7, further comprising:
providing a signal strength indicator of the photodiode as an output of the voltage controller.

12. A circuit, comprising:
a voltage source operable to output a first voltage;
a reference voltage source operable to output a reference voltage;
a programmable reference voltage controller operable to control the reference voltage based on an offset bias received from an offset bias module, wherein the offset bias is based on the first voltage;
a circuit element biased, during operation, by the first voltage at a first end and by a second voltage at a second end;
a voltage controller coupled to the second end of the circuit element, wherein the voltage controller is operable to adjust the second voltage based on a gain output;
a gain controller operable to receive the reference voltage as a first input and the second voltage as a second input, wherein the gain controller is operable to generate, at an output of the gain controller, the gain output based on the second voltage and the reference voltage; and
a feedback loop that extends from the output of the gain controller, through the voltage controller, and to the second input.

13. The circuit of claim 12, wherein the voltage controller comprises a first transistor, wherein a gate of the first transistor is coupled to the output of the gain controller.

14. The circuit of claim 13, wherein the voltage controller comprises a second transistor, wherein a gate of the second transistor is coupled to the output of the gain controller, wherein the second transistor and the first transistor form a current mirror.

15. The circuit of claim 12, wherein the gain controller comprises an operational amplifier.

16. The circuit of claim 12, further comprising:
one or more bleeder currents operable to ensure a minimum current flow through at least one of the voltage controller or the feedback loop.

* * * * *

UNITED STATES PATENT AND TRADEMARK OFFICE
CERTIFICATE OF CORRECTION

| | | |
|---|---|---|
| PATENT NO. | : 11,552,600 B2 | |
| APPLICATION NO. | : 16/553950 | |
| DATED | : January 10, 2023 | |
| INVENTOR(S) | : Alexander C. Kurylak et al. | |

It is certified that error appears in the above-identified patent and that said Letters Patent is hereby corrected as shown below:

In the Claims

In Column 9, Line 67, in Claim 6, delete "and" and insert -- or --.

Signed and Sealed this
Twenty-eighth Day of March, 2023

Katherine Kelly Vidal
*Director of the United States Patent and Trademark Office*